US006304116B1

United States Patent
Yoon et al.

(10) Patent No.: US 6,304,116 B1
(45) Date of Patent: Oct. 16, 2001

(54) DELAY LOCKED LOOPED CIRCUITS AND METHODS OF OPERATION THEREOF

(75) Inventors: Hong-il Yoon, Seoul; Chang-sik Yoo, Kyunggi-do, both of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/484,902

(22) Filed: Jan. 18, 2000

(30) Foreign Application Priority Data

Jan. 26, 1999 (KR) .................................................. 99-2404

(51) Int. Cl.[7] .................................................. H03L 7/06
(52) U.S. Cl. .............................. 327/158; 327/3; 327/12; 327/161
(58) Field of Search ........................... 327/2, 3, 12, 149, 327/153, 158, 161

(56) References Cited

U.S. PATENT DOCUMENTS

| | | | |
|---|---|---|---|
| 5,120,990 | * 6/1992 | Koker | 327/2 |
| 5,408,200 | * 4/1995 | Buhler | 331/1 A |
| 5,570,054 | * 10/1996 | Takla | 327/292 |
| 5,574,756 | * 11/1996 | Jeong | 375/376 |
| 5,663,665 | * 9/1997 | Wang et al. | 327/3 |
| 5,712,884 | * 1/1998 | Jeong | 375/375 |
| 5,969,552 | * 10/1999 | Lee et al. | 327/158 |

FOREIGN PATENT DOCUMENTS

| | | |
|---|---|---|
| 58-13044 | 1/1983 | (JP) . |
| 4-115625 | 4/1999 | (JP) . |

OTHER PUBLICATIONS

*IEEE Journal of Solid–State Circuits*, vol. 31, No. 7, pp. 952–957 (Jul., 1996).

* cited by examiner

*Primary Examiner*—Terry D. Cunningham
*Assistant Examiner*—Quan Tra
(74) *Attorney, Agent, or Firm*—Myers Bigel Sibley & Sajovec

(57) ABSTRACT

The present invention provides delay locked loop circuits, phase detectors and methods for producing a delayed signal from a periodic input signal. An intermediate delay signal as well as an input signal and a delayed output signal are provided to a delay control circuit that controls the delay of a delay circuit based on a comparison of the input signal and output signal following a transition of the intermediate signal. The apparatus and methods of the present invention may thereby be able to distinguish between a case in which tTOTAL=T and tTOTAL=2T to reduce the potential for locking in a false state.

17 Claims, 7 Drawing Sheets

DELAY LOCKED LOOPED CIRCUITS AND METHODS OF OPERATION THEREOF

RELATED APPLICATION

This application is related to Korean Application No. 99-2404, filed Jan. 26, 1999, the disclosure of which is hereby incorporated herein by reference.

FIELD OF THE INVENTION

The present invention relates to integrated circuit devices and methods of operation thereof, and more particularly, to apparatus and methods for synchronizing clock signals in integrated circuit devices.

BACKGROUND OF THE INVENTION

Integrated circuit devices such as microprocessors, memories and other peripheral circuits typically operate in a synchronized fashion at very high speeds. For example, such devices may operate in synchronization with an external clock signal using an internal clock signal which is delayed for a predetermined length of time with respect to the external clock signal. The performance of such devices may be subject to degradation at the high clock frequencies associated with high speed operations. For example, the length of time used for outputting data after the external clock signal is applied, sometimes referred to as the output data access time tAC, may be lengthened. Thus, such a device often includes one or more circuits for generating clock signals synchronized to a reference clock signal. One example of a circuit for synchronizing an external clock and an internal clock is a delay locked loop (DLL) which may reduce deterioration of the operational performance of the integrated circuit device at high frequencies. The DLL is also widely used for a clock recovery systems, time-to-digital conversion circuits, and high speed serial links.

A typically DLL circuit generates a delayed clock signal from a reference clock signal, with the delayed clock signal typically being used as a reference signal for operation of devices. A typically DLL circuit uses a phase comparator to compare the phase of the reference clock signal with that of the delayed clock signal, and feeds back the comparison result to a delay controller that varies the delay of the delayed clock signal. A DLL may be implemented as an analog DLL, a digital DLL, or a hybrid DLL may be used. The analog DLL typically has good jitter characteristics but may be locked into an incorrect (false) state in which the internal clock signal is delayed by one or even more periods with respect to an external clock signal. False locking is generally undesirable due to potentially increased noise susceptibility as well as jitter accumulation.

FIG. 1 illustrates a prior art analog DLL. As shown in FIG. 1, the prior art analog DLL includes a delay line 11 including a plurality of unit delays d1 through dn which are connected in series. A phase detector 13 receives an input clock signal CLKIN and an output clock signal CLKOUT of the delay line 11 to detect the difference in phase between them. A charge pump circuit 15 generates a control voltage to vary the delay time of the unit delays d1 through dn in response to output signals FWD and BCK from the phase detector 13. In the illustrated DLL, the input clock signal CLKIN may be an external clock signal and the output clock signal CLKOUT may be an internal clock signal.

The phase detector 13 may be a reset-set (RS) type phase detector or a three-state phase frequency detector (PFD). Operational timing diagrams of an RS type phase detector are illustrated in FIGS. 2a and 2b. Operational timing diagrams of the three-state PFD are illustrated in FIGS. 3a and 3b. FIGS. 2a and 3a show the timing for the case in which the total delay tTOTAL of the delay line 11 is less than the period T of the input clock signal CLKIN. In other words, for tTOTAL=Δ. FIGS. 2B and 3B illustrate timing for the case in which the total delay tTOTAL of the delay line 11 is more than the period T of the input clock signal CLKIN. In other words, for tTOTAL=Δ+T.

In the illustrated analog DLL using the RS type phase detector or the three-state PFD as the phase detector 13, when tTOTAL=Δ, the output signal FWD controls the charge pump circuit 15 to increase the delay time of the unit delays d1 through dn, so that the analog DLL may be locked to provide a delay time of tTOTAL=T. However, when tTOTAL=Δ+T, the output signals BCK and FWD are controlled in the same manner as in the case when tTOTAL=Δ. As a result, the analog DLL may be maintained in a false state, i.e., locked to a delay in which tTOTAL=2T.

In other words, the RS type phase detector or the three-state PFD provides the same output signals BCK and FWD for under conditions when tTOTAL=Δ+mT, where m=0, 1, 2, . . . , and, thus, when tTOTAL=Δ+mT, where m=1, 2, . . . , the analog DLL is in a false state, i.e., locked to a delay condition in which tTOTAL=nT, where n=2, 3, 4, . . . , In many cases, the unit delays d1 through dn are provided with a limited range of possible delays, therefore, a false state is most likely locked in to a condition where tTOTAL=2T.

It is known to take certain steps to limit the potential for false locking. For example, the delay time of the unit delays d1 through dn can be initialized to a minimum or maximum value such that the analog DLL may be able to recognize whether the delay time of the unit delays d1 through dn is to be increased or reduced to suppress false locking. However, additional circuits or an increase in locking time are typically required to implement these approaches.

SUMMARY OF THE INVENTION

The present invention provides delay locked loop circuits, phase detectors and methods for producing a delayed signal from a periodic input signal. An intermediate delay signal as well as an input signal and a delayed output signal are provided to a delay control circuit that controls the delay of a delay circuit based on a comparison of the input signal and output signal following a transition of the intermediate signal. The apparatus and methods of the present invention may thereby be able to distinguish between a case in which tTOTAL=T and tTOTAL=2T to reduce the potential for locking in a false state.

In one embodiment of the present invention a delay locked loop circuit is provided including a delay circuit that receives an input clock signal and produces an output clock signal and an intermediate clock signal that are delayed with respect to the input clock signal responsive to a delay control signal applied to the delay circuit. The intermediate clock signal is delayed less than the output clock signal. A delay control circuit, responsive to the input clock signal, the intermediate clock signal and the output clock signal, applies a delay control signal to the delay circuit based on a comparison of a transition of the output clock signal, a transition of the input clock signal and a transition of an intermediate clock signal. The delay control circuit may generate the delay control signal based on a timing of the transition of the input clock signal relative to the transition of the output clock signal following the transition of the intermediate clock signal.

In a further embodiment of the present invention, the delay control circuit includes a phase detector circuit that receives the input clock signal, the intermediate clock signal and the output clock signal and generates a first phase comparison signal when, following the transition of the intermediate clock signal, the transition of the output clock signal lags the transition of the input clock signal and a second phase comparison signal when the transition of the output clock signal leads the transition of the input clock signal. A delay control signal generating circuit applies a delay control signal to the delay circuit responsive to the phase comparison signals. The delay control signal generating circuit may be a charge pump circuit that generates the delay control signal responsive to the phase comparison signals. The first phase comparison signal and the second phase comparison signal may be a first state and a second state of a single comparison signal or two separate signals. The delay control circuit may reduce a delay of the output clock signal relative to the input clock signal responsive to the first phase comparison signal and increase the delay of the output clock signal relative to the input clock signal responsive to the second phase comparison signal.

In another embodiment of the present invention, the phase detector circuit asserts the first phase comparison signal for a time extending substantially from the transition of the input clock signal to the transition of the output clock signal, and the phase detector circuit asserts the second phase comparison signal for a time extending substantially from the transition of the output clock signal to the transition of the input clock signal. The transitions may be rising edges and the phase detector circuit may include a first flip-flop having a clock input, a reset input and an output, the first flip-flop receiving the intermediate clock signal at the clock input to set a ready signal at the output responsive to the rising edge of the intermediate clock signal and to reset the ready signal responsive to a reset signal at the reset input. A second flip-flop has a clock input, a data input connected to the ready signal, a reset input and an output, the second flip-flop receiving the input clock signal at the clock input and the ready signal at the data input to set the first phase comparison signal at the output of the second flip-flop responsive to the rising edge of the input clock signal and to reset the first phase comparison signal responsive to a reset signal at the reset input.

A third flip-flop has a clock input, a data input connected to the ready signal, a reset input, and an output, the third flip-flop receiving the output clock signal at the clock input to set the second phase comparison signal at the output of the third flip-flop responsive to the rising edge of the output clock signal and to reset the second phase comparison signal responsive to a reset signal at the reset input. A reset circuit which is coupled to the reset inputs of the first, second and third flip-flops applies the reset signals to the reset inputs of the first, second and third flip flops responsive to setting of all of the ready signal, the second phase comparison signal and the first phase comparison signal.

In yet another embodiment, the transitions are edges and the phase detector circuit includes a first flip-flop that sets a ready signal responsive to the edge of the intermediate clock signal and resets the ready signal responsive to a reset signal. A second flip-flop sets the first phase comparison signal responsive to the edge of the input clock signal and resets the first phase comparison signal responsive to the reset signal. A third flip-flop sets the second phase comparison signal responsive to the edge of the output clock signal and resets the second phase comparison signal responsive to the reset signal. A reset circuit sets the reset signal responsive to setting of all of the ready signal, the second phase comparison signal and the first phase comparison signal.

In another embodiment of the present invention, the delay circuit includes a plurality of unit delay circuits having associated delay times. The unit delays may be connected in series. The delay control circuit may reduce the associated delay times responsive to the first phase comparison signal and increase the associated delay times responsive to the second phase comparison signal. In another embodiment, the delay control circuit detects a difference in phase of the input clock signal, the intermediate clock signal and the output clock signal and applies the delay control signal responsive to the detected difference in phase.

In another aspect of the present invention, a phase detector apparatus is provided including a phase detector circuit that receives an input clock signal, an intermediate clock signal and an output clock signal and generates a first phase comparison signal when, following the transition of the intermediate clock signal, the transition of the output clock signal lags the transition of the input clock signal and a second phase comparison signal when the transition of the output clock signal leads the transition of the input clock signal. The transitions may be edges.

In yet another aspect of the present invention, a method of producing a delayed signal from a periodic input signal is provided. An intermediate signal is generated from the periodic input signal, the intermediate signal being delayed from the periodic input signal. A delayed signal is generated from the periodic input signal, the delayed signal being delayed from the intermediate signal. Operations further include determining whether a transition of the periodic input signal leads or lags a transition of the delayed signal following a transition of the intermediate signal. The delay of the delayed signal with respect to the periodic input signal is varied based on the determination of whether the transition of the periodic input signal leads or lags the transition of the delayed signal. The periodic input signal may be an input clock signal, the delayed signal may be a delayed clock signal and the transitions may be rising edges.

In one embodiment, the delay is varied by either asserting a first phase comparison signal when, following the edge of the intermediate clock signal, the edge of the input clock signal leads the edge of the output clock signal or by asserting a second phase comparison signal when, following the edge of the intermediate clock signal, the edge of the input clock signal lags the edge of the output clock signal. A delay control signal is generated responsive to the first and second phase comparison signals and the delay of the delayed clock signal is varied responsive to the delay control signal.

In another embodiment of the present invention, a method of producing a delayed signal from a periodic input signal is provided. An intermediate signal is generated from the periodic input signal, the intermediate signal being delayed from the periodic input signal and a delayed signal is generated from the periodic input signal, the delayed signal being delayed from the intermediate signal. A difference in phase of the input clock signal, the intermediate clock signal and the output clock signal is determined and the delay of the delayed signal with respect to the periodic input signal is varied based on the determination of the difference in phase. The periodic input signal may be an input clock signal and the delayed signal may be a delayed clock signal.

DETAILED DESCRIPTION OF EMBODIMENTS

Figure 1:
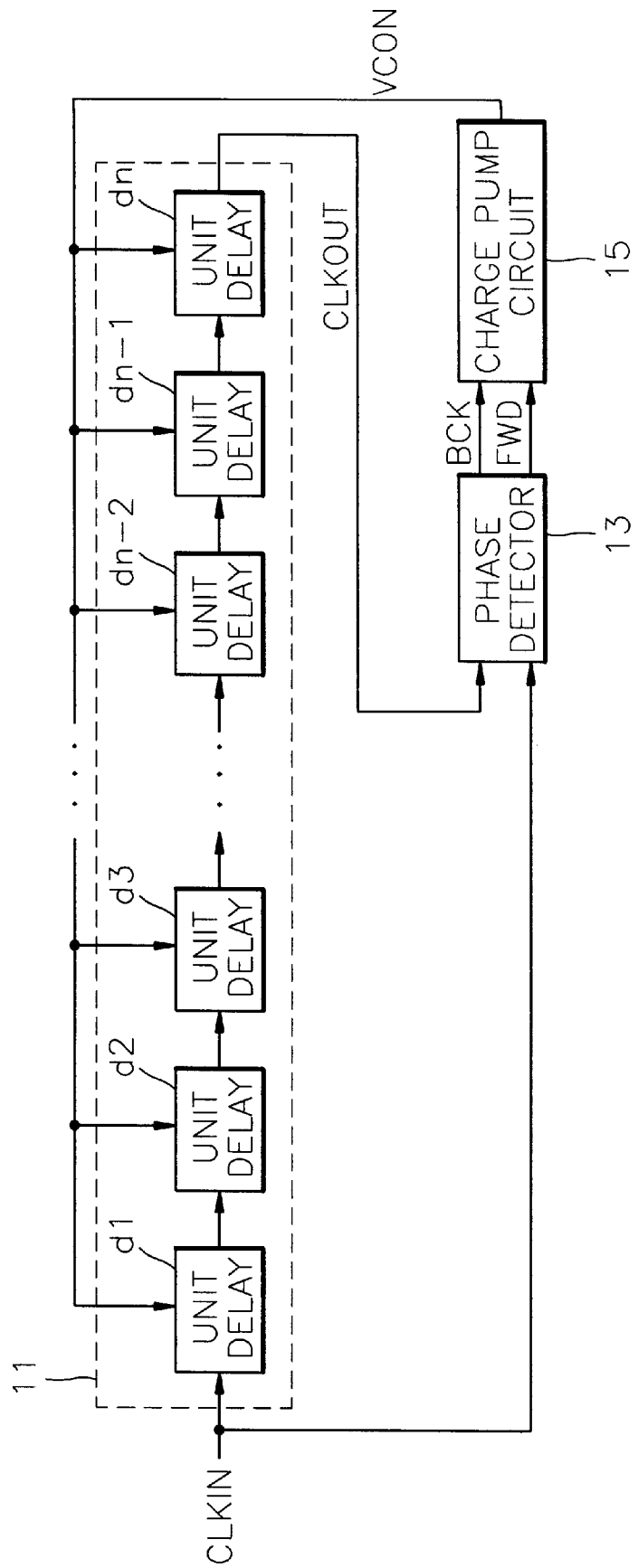
FIG. 1 is a block diagram illustrating an analog delay locked loop (DLL) according to the prior art.
Figure 2A:
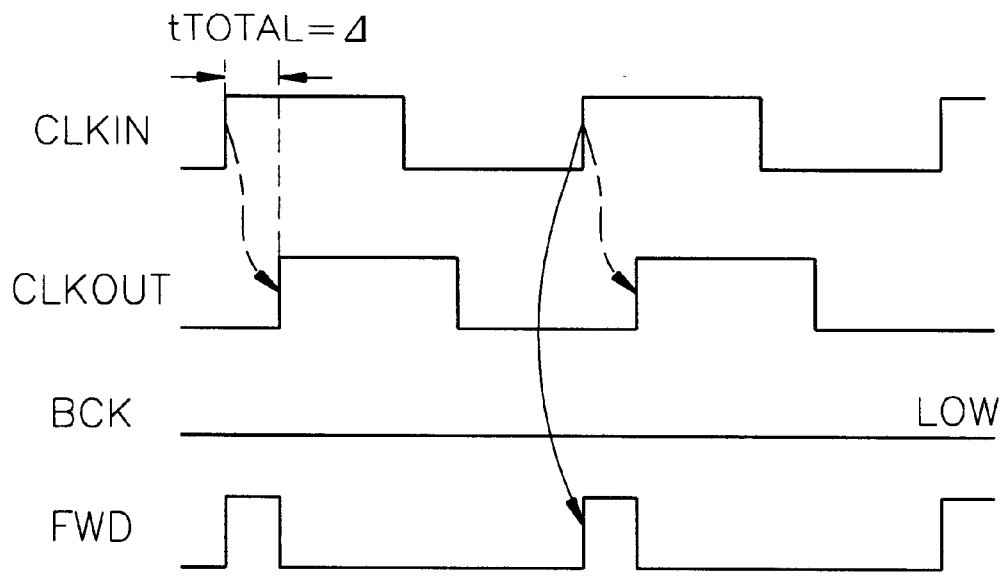
FIGS. 2A and 2B are timing diagrams illustrating exemplary operations of an RS type phase detector according to the prior art.
Figure 2B:
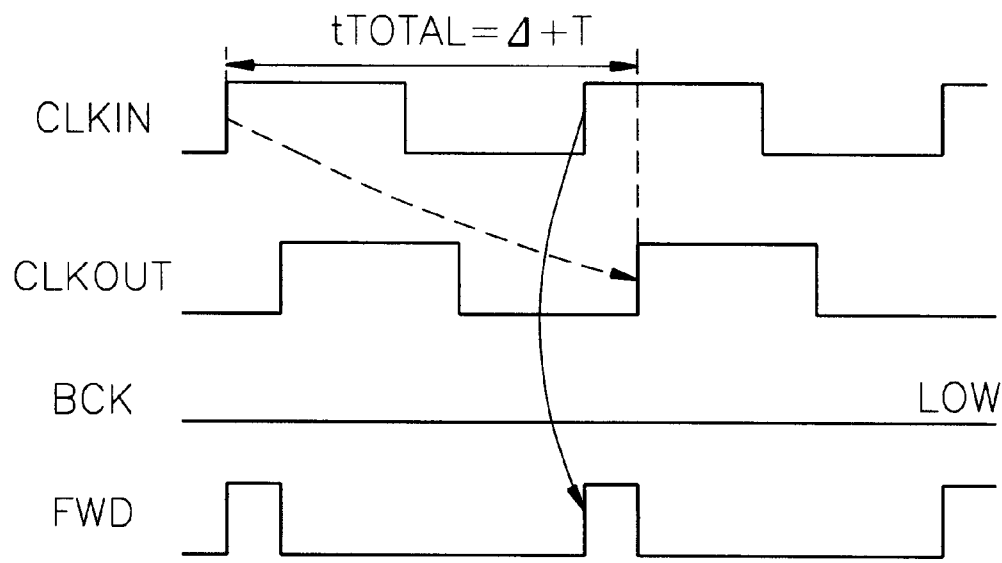
Figure 3A:
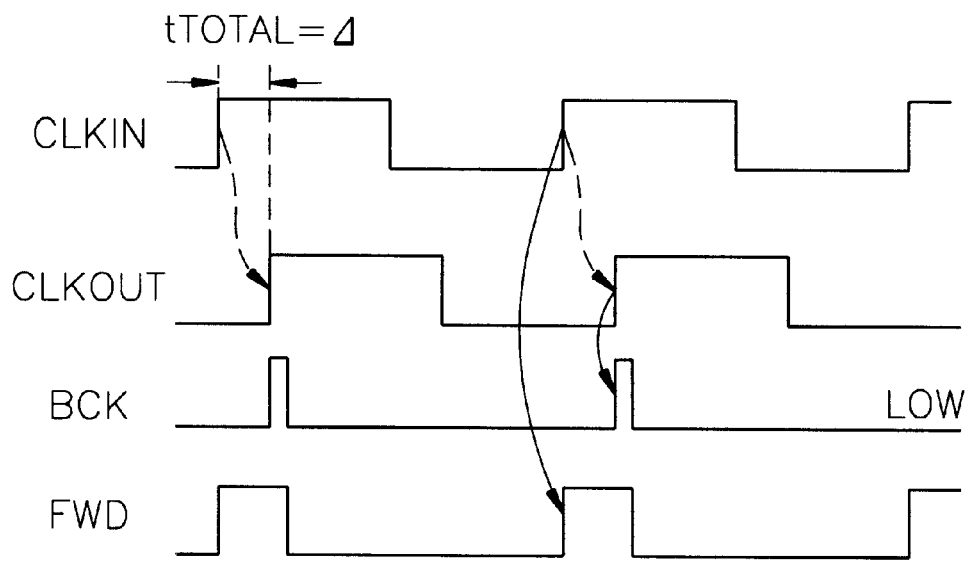
FIGS. 3A and 3B are timing diagrams illustrating exemplary operations of a three-state phase frequency detector (PFD) according to the prior art.
Figure 3B:
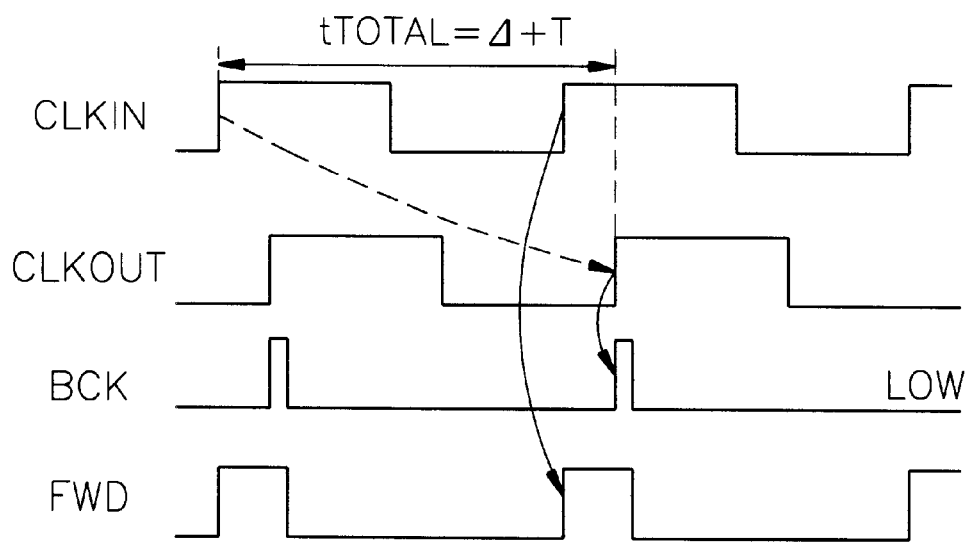

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. While the present invention is generally described herein with reference to embodiments in which an active state (set or "1") is a high voltage and an inactive (reset or "0") is a low voltage, it is to be understood that the present invention may also be implemented with a complementary logic in which the active state is a low voltage and the inactive state is a high voltage. Similarly, for such complementary logic embodiments reference to a rising edge herein is still to be understood as referring to a transition from an inactive state to an active state even though the associated voltage change is from a high to a low voltage.

Figure 4:
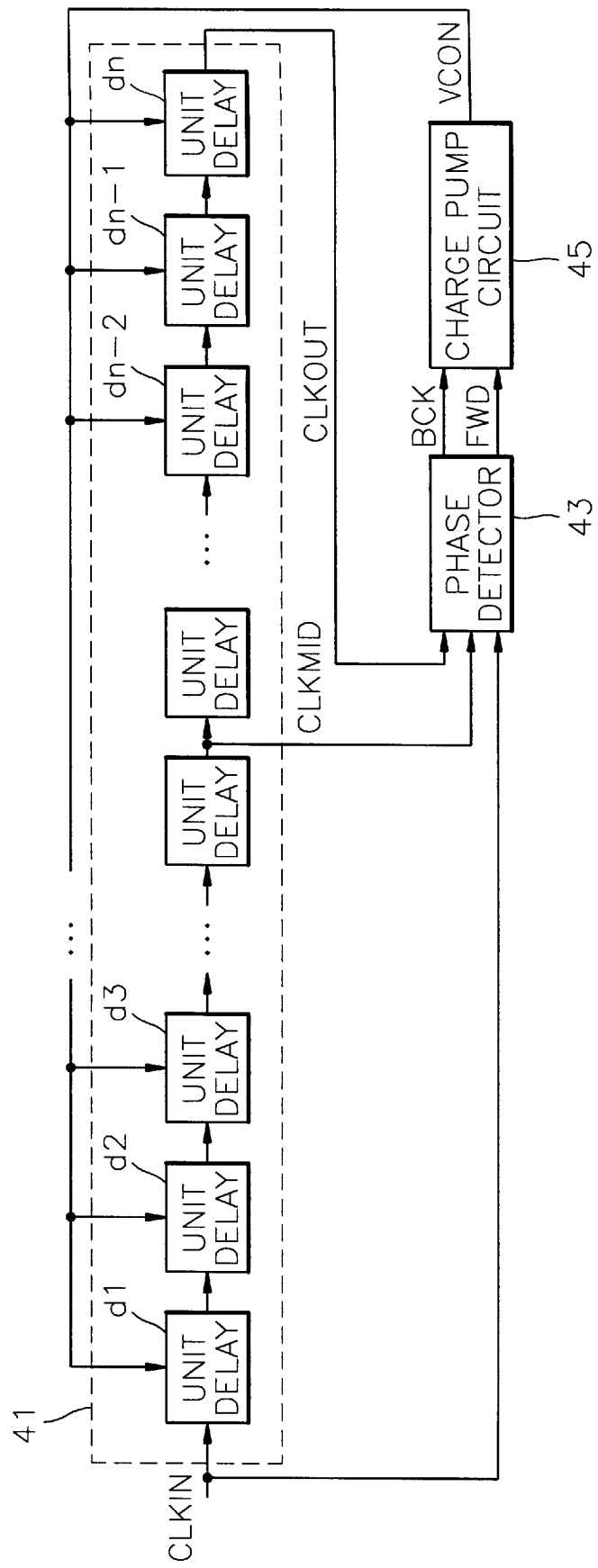
FIG. 4 is a block diagram of a DLL according to an embodiment of the present invention.

Referring now to FIG. 4, a delay locked loop (DLL) according to an embodiment of the present invention will now be further described. The illustrated embodiment is an analog DLL which includes a delay line 41, a phase detector 43, and a charge pump circuit 45. The delay line 41 includes a plurality of unit delays d1 through dn connected in series. The delay line 41 is configured to delay an input clock signal CLKIN to output an output clock signal CLKOUT. The phase detector 43 receives the input clock signal CLKIN and an intermediate clock signal, which will be referred to as a middle clock signal CLKMID, from the delay line 41. More particularly, the middle clock signal CLKMID in the illustrated embodiment is output from a unit delay positioned substantially in the middle of the unit delays d1 through dn. The phase detector also receives the output clock signal CLKOUT and is configured to detect a difference in phases between CLKIN, CLKMID and CLKOUT to generate first and second phase comparison output signals BCK and FWD.

While the illustrated embodiment shows CLKMID as being provided by a substantially middle unit delay, it is to be understood that CLKMID can be an output signal from others of the unit delays positioned between the unit delay d1 and the unit delay dn. However, preferably, the middle clock signal is an output signal of a unit delay substantially in the center between the unit delay d1 and the unit delay dn.

The charge pump circuit 45 generates a control voltage VCON as a delay control signal that varies delay time of the unit delays d1 to dn in response to the first and second phase comparison signals BCK and FWD. The charge pump circuit 45 may, for example, be controlled by the first and the second phase comparison signals BCK and FWD to charge and discharge a loop capacitor (not shown) which may have constant current capability.

Figure 5A:
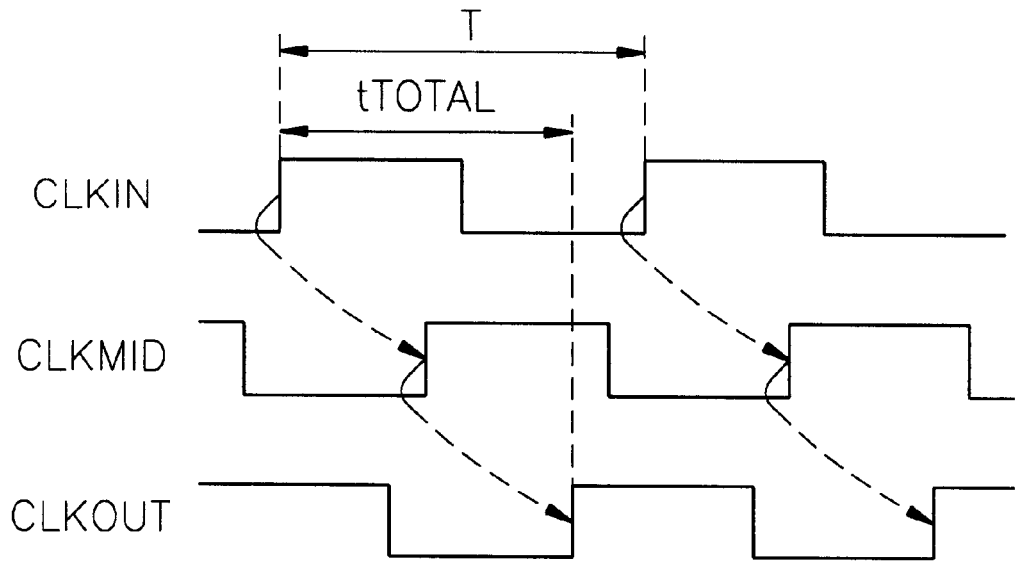
FIG. 5A is a timing diagram illustrating exemplary operations of the DLL of FIG. 4 for the case when tTOTAL<T.
Figure 5B:
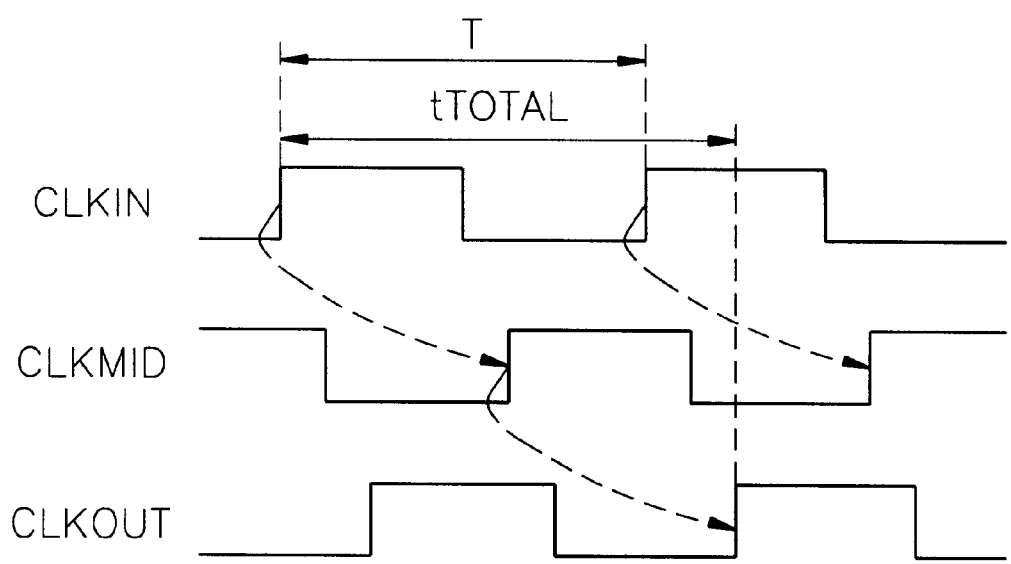
FIG. 5B is a timing diagram illustrating exemplary operations of the DLL of FIG. 4 for the case when tTOTAL>T.

The middle clock signal CLKMID is input to the phase detector 43 to facilitate detection of the case in which the total delay tTOTAL of the delay line 41 is less than the period T of the input clock signal CLKIN, i.e., tTOTAL<T, and the case in which total delay tTOTAL of the delay line 41 is more than the period T of the input clock signal CLKIN, i.e., tTOTAL>T as will now be described. As shown in FIG. 5A, when tTOTAL<T, the sequence of transitions defined by the rising edges is CLKIN, CLKMID, CLKOUT, CLKIN, CLKMID, CLKOUT, etc. However, as shown in FIG. 5B, when tTOTAL>T, the sequence of transitions defined by the rising edges is CLKIN, CLKOUT, CLKMID, CLKIN, CLKOUT, CLKMID, etc. The, the phase detector 43 may, thereby, monitor the sequence of the rising edges to distinguish whether tTOTAL<T or tTOTAL>T.

More particularly, for the illustrated embodiment as shown in FIGS. 4, 5A and 5B, the phase detector 43 determines that tTOTAL>T when the rising edge of CLKIN leads the rising edge of CLKOUT following detection of the rising edge of CLKMID (FIG. 5B). The charge pump circuit 45 may then, responsive to the first phase comparison signal BCK of the phase detector 43, reduce the delay time of the unit delays d1 through dn so that the DLL may be locked to a delay where tTOTAL=T. The phase detector 43 is further configured to determine that tTOTAL<T when the rising edge of CLKOUT leads the rising edge of CLKIN following the rising edge of the CLKMID (FIG. 5A). The charge pump circuit 45 may then, responsive to the second phase comparison signal FWD of the phase detector 43, increase the delay time of the unit delays d1 through dn, again so that the DLL may be locked to a delay where tTOTAL=T.

Figure 6:
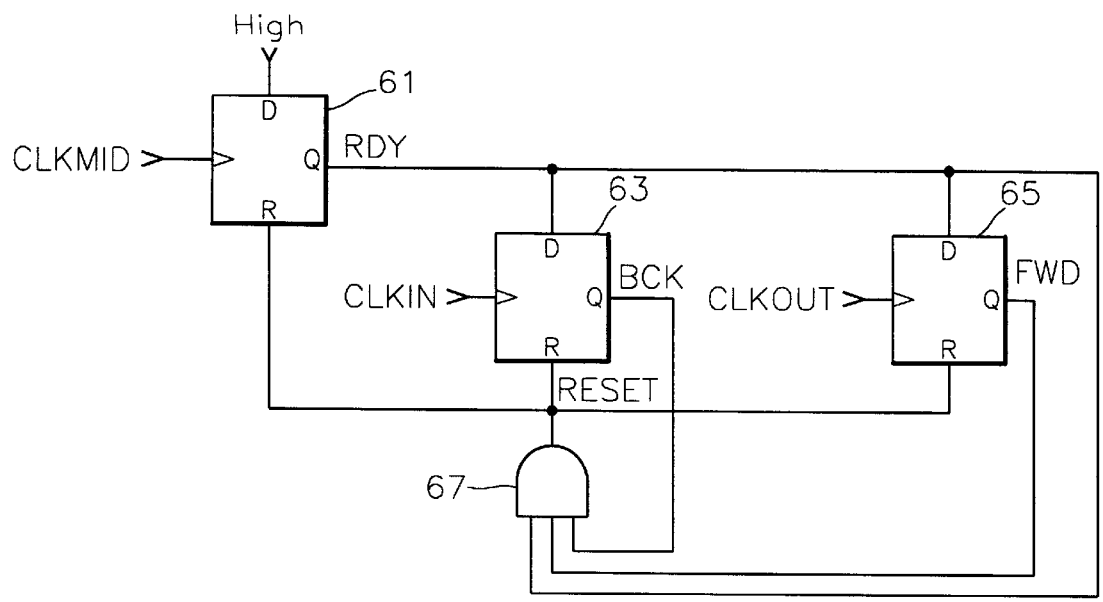
FIG. 6 is a circuit diagram of the phase detector of FIG. 4.

FIG. 6 is a circuit diagram further illustrating the phase detector 43 of FIG. 4. A shown in FIG. 6, the phase detector 43 includes first through third flip-flops 61, 63 and 65, and a reset circuit which, in the illustrated embodiment is an AND gate 67. As noted above, for the purposes of description of this invention the active (set) state will be illustrated as a high voltage and the inactive (reset) state will be illustrated as a low voltage. The first flip-flop 61 has a clock input, a reset input and an output and receives the intermediate clock signal at the clock input. The first flip-flop 61 activates (sets) a ready signal RDY at its output (Q) responsive to the rising edge of the middle clock signal CLKMID at its clock input and deactivates (resets) the ready signal RDY responsive to a reset signal RESET. The second flip-flop 63 has a clock input, a data input connected to the ready signal RDY, a reset input and an output. The second flip-flop 63 activates the first phase comparison signal BCK at its output responsive to the rising edge of the input clock signal CLKIN received at its clock input when the ready signal RDY is activated and deactivates the first phase comparison signal BCK responsive to a reset signal RESET at the reset input of the flip-flop.

The third flip-flop 65 includes a clock input, a data input connected to the ready signal RDY, a reset input and an output. The third flip-flop 65 activates the second phase comparison signal FWD at its output responsive to the rising edge of the output clock signal CLKOUT at its clock input when the ready signal RDY is activated and deactivates the second phase comparison signal FWD responsive to the reset signal RESET at its reset input.

The AND gate 67 activates the reset signal RESET when the ready signal RDY, the first phase comparison signal BCK, and the second phase comparison signal FWD are activated (set). The AND gate 67 has its output coupled to the reset inputs of the first, second and third flip-flops 61, 63, 65 and applies the reset signal RESET to the flip-flops. As a result, the first phase comparison signal BCK and the second phase comparison signal FWD are deactivated (reset).

It will be appreciated that the various components illustrated by the blocks and circuits of FIGS. 1, 4 and 6 may be implemented using a variety of hardware. For example, the various gates and flip-flops may be implemented using special-purpose hardware, such as an application specific integrated circuit (ASIC), a programmable logic devices (PLD), a gate array, and/or other types of integrated circuits. It also will be appreciated that although functions of the respective circuits may be integrated in a single device, such as a single ASIC, they may also be distributed among multiple devices.

Figure 7:
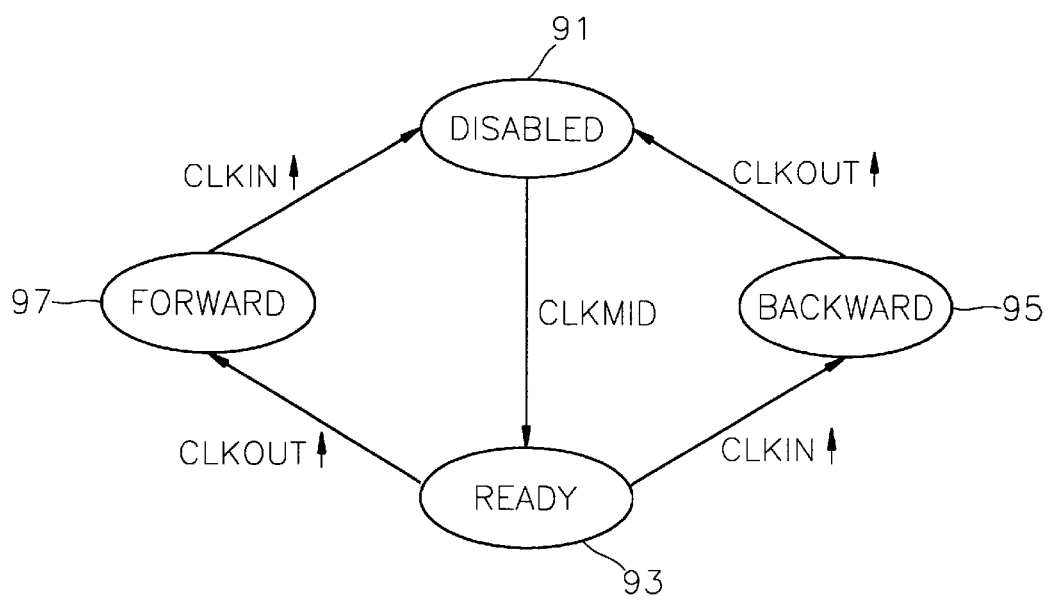
FIG. 7 is a state transition diagram of the phase detector of FIG. 6.

Operations according to the present invention will now be further described with reference to FIGS. 7 and 8. FIG. 7 is a state transition diagram of the phase detector 43 of FIG. 6. FIG. 8 is an exemplary timing diagram illustrating operations of the phase detector 43 of FIG. 6. When the ready signal RDY, the first phase comparison signal BCK, and the second phase comparison signal FWD are all activated, the reset signal RESET is activated. As a result, the first through third flip-flops 61, 63 and 65 are reset (DISABLED state 91 of FIG. 7). That is, the ready signal RDY, the first phase comparison signal BCK, and the second phase comparison signal FWD are initialized to a reset or logic "low" condition for the illustrated embodiment. Thee ready signal RDY may then be set (activated) responsive to the rising edge of the middle clock signal CLKMID (READY state 93 of FIG. 7).

Figure 8A:
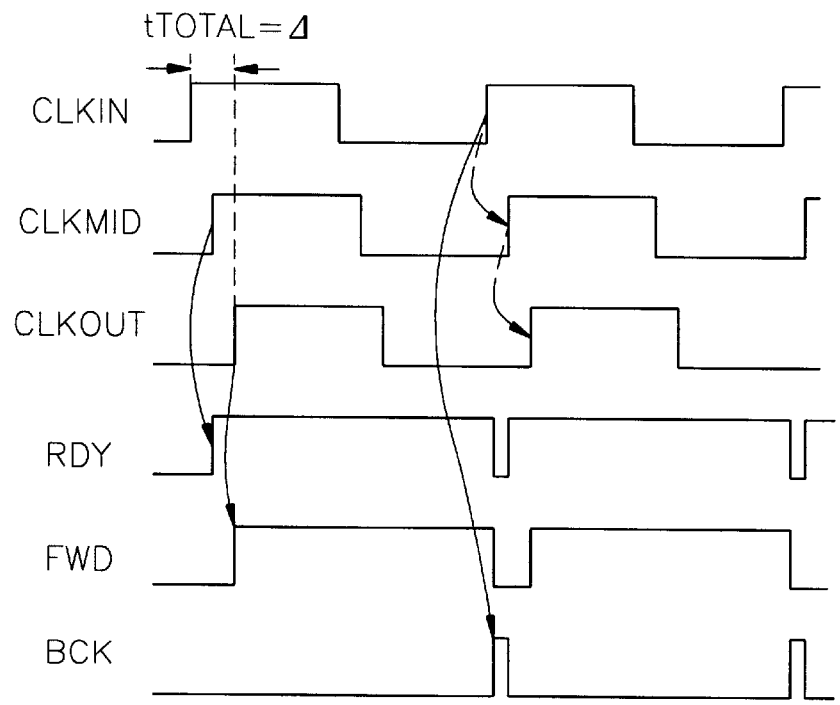
FIGS. 8A and 8B are timing diagrams illustrating exemplary operations of the phase detector of FIG. 6.

When the ready signal RDY is activated and the subsequent rising edge of the output clock signal CLKOUT leads the rising edge of the input clock signal CLKIN (as shown in FIG. 8A), the second phase comparison signal FWD is activated responsive to the rising edge of the output clock signal CLKOUT. Thus, the charge pump circuit 45, is controlled by the second phase comparison signal FWD to increase the delay time of the unit delays d1 through dn (FORWARD state 97 of FIG. 7). When the first phase comparison signal BCK is subsequently activated responsive to the rising edge of the input clock signal CLKIN, the ready signal RDY, the first phase comparison signal BCK, and the second phase comparison signal FWD are all in a logic "high" (set) condition. As a result, the first through third flip-flops 61, 63 and 65 are reset (DISABLED state 91 of FIG. 7). In this manner, the ready signal RDY, the first phase comparison signal BCK, and the second phase comparison signal FWD are initialized to a logic "low" reset state.

Figure 8B:
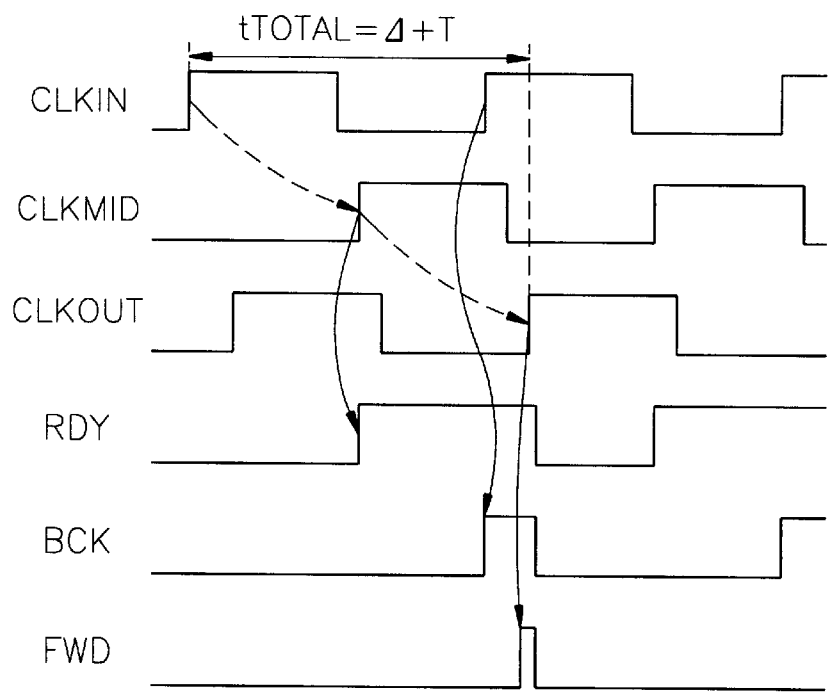

When the ready signal RDY is activated and the subsequent rising of the input clock signal CLKIN leads the rising edge of the output clock signal CLKOUT (as shown in FIG. 8B), the first phase comparison signal BCK is activated responsive to the rising edge of the input clock signal CLKIN. Thus, the charge pump circuit 45 is controlled by the first phase comparison signal BCK, to reduce the delay time of the unit delays d1 through dn (BACKWARD state 95 of FIG. 7). When, the second phase comparison signal FWD is subsequently activated responsive to the rising edge of the output clock signal CLKOUT, the ready signal RDY, the first phase comparison signal BCK, and the second phase comparison signal FWD are all in a logic "high" (set) condition. As a result, the first through third flip-flops 61, 63 and 65 are reset (DISABLED state 91 of FIG. 7). In this manner, the ready signal RDY, the first phase comparison signal BCK, and the second phase comparison signal FWD are initialized to a logic "low" reset state.

As described above, a phase detector according to the present invention may be able to control the delay time of the unit delays d1 through dn, and suppress locking of the DLL in a false state such as with a delay of tTOTAL=2T. The delay locked loop may then control the delay of the output clock signal when tTOTAL<T and when tTOTAL>T, to maintain tTOTAL=T. Furthermore, the present invention may be provided with simple circuitry and may provide a short locking time.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A delay locked loop circuit, comprising:
   a delay circuit that receives an input clock signal and produces an output clock signal and an intermediate clock signal that are delayed with respect to the input clock signal responsive to a delay control signal applied to the delay circuit, the intermediate clock signal being delayed less than the output clock signal;
   a delay control circuit, responsive to the input clock signal, the intermediate clock signal and the output clock signal, that applies the delay control signal to the delay circuit based on a comparison of a transition of the output clock signal, a transition of the input clock signal and a transition of the intermediate clock signal, the delay control circuit comprising a phase detector circuit that receives the input clock signal, the intermediate clock signal and the output clock signal and generates a first phase comparison signal when, following the transition of the intermediate clock signal, the transition of the output clock signal lags the transition of the input clock signal and a second phase comparison signal when the transition of the output clock signal leads the transition of the input clock signal; and
   wherein the phase detector circuit asserts the first phase comparison signal for a time extending substantially from the transition of the input clock signal to the transition of the output clock signal, and wherein the phase detector circuit asserts the second phase comparison signal for a time extending substantially from the transition of the output clock signal to the transition of the input clock signal.

2. A circuit according to claim 1, wherein the delay control circuit further comprises:
   a delay control signal generating circuit that applies the delay control signal to the delay circuit responsive to the phase comparison signals.

3. A circuit according to claim 2, wherein the delay control signal generating circuit comprises a charge pump circuit that generates the delay control signal responsive to the phase comparison signals.

4. A circuit according to claim 2 wherein the first phase comparison signal and the second phase comparison signal comprise a first state and a second state of a single phase comparison signal.

5. A delay locked loop circuit, comprising:
a delay circuit that receives an input clock signal and produces an output clock signal and an intermediate clock signal that are delayed with respect to the input clock signal responsive to a delay control signal applied to the delay circuit, the intermediate clock signal being delayed less than the output clock signal;
a phase detector circuit, responsive to the input clock signal, the intermediate clock signal and the output clock signal, that applies the delay control signal to the delay circuit based on a comparison of a transition of the output clock signal, a transition of the input clock signal and a transition of the intermediate clock signal, wherein the phase detector circuit generates a first phase comparison signal when, following the transition of the intermediate clock signal, the transition of the output clock signal lags the transition of the input clock signal and a second phase comparison signal when the transition of the output clock signal leads the transition of the input clock signal;
wherein the transitions are edges and wherein the phase detector circuit comprises:
a first flip-flop having a clock input, a reset input and an output, the first flip-flop receiving the intermediate clock signal at the clock input to set a ready signal at the output responsive to the edge of the intermediate clock signal and to reset the ready signal responsive to a reset signal at the reset input;
a second flip-flop having a clock input, a data input connected to the ready signal, a reset input and an output, the second flip-flop receiving the input clock signal at the clock input and the ready signal at the data input to set the first phase comparison signal at the output of the second flip-flop responsive to the edge of the input clock signal and to reset the first phase comparison signal responsive to a reset signal at the reset input;
a third flip-flop having a clock input, a data input connected to the ready signal, a reset input, and an output, the third flip-flop receiving the output clock signal at the clock input to set the second phase comparison signal at the output of the third flip-flop responsive to the edge of the output clock signal and to reset the second phase comparison signal responsive to a reset signal at the reset input; and
a reset circuit coupled to the reset inputs of the first, second and third flip-flops that applies the reset signals to the reset inputs of the first, second and third flip flops responsive to setting of all of the ready signal, the second phase comparison signal and the first phase comparison signal.

6. A delay locked loop circuit, comprising:
a delay circuit that receives an input clock signal and produces an output clock signal and an intermediate clock signal that are delayed with respect to the input clock signal responsive to a delay control signal applied to the delay circuit, the intermediate clock signal being delayed less than the output clock signal;
a phase detector circuit, responsive to the input clock signal, the intermediate clock signal and the output clock signal, that applies the delay control signal to the delay circuit based on a comparison of a transition of the output clock signal, a transition of the input clock signal and a transition of the intermediate clock signal, wherein the phase detector circuit generates a first phase comparison signal when, following the transition of the intermediate clock signal, the transition of the output clock signal lags the transition of the input clock signal and a second phase comparison signal when the transition of the output clock signal leads the transition of the input clock signal;
wherein the transitions are edges and wherein the phase detector circuit comprises:
a first flip-flop that sets a ready signal responsive to the edge of the intermediate clock signal and resets the ready signal responsive to a reset signal;
a second flip-flop that sets the first phase comparison signal responsive to the edge of the input clock signal and resets the first phase comparison signal responsive to the reset signal;
a third flip-flop that sets the second phase comparison signal responsive to the edge of the output clock signal and resets the second phase comparison signal responsive to the reset signal; and
a reset circuit that sets the reset signal responsive to setting of all of the ready signal, the second phase comparison signal and the first phase comparison signal.

7. A circuit according to claim 1 wherein the delay control circuit reduces a delay of the output clock signal relative to the input clock signal responsive to the first phase comparison signal and increases the delay of the output clock signal relative to the input clock signal responsive to the second phase comparison signal.

8. A circuit according to claim 7 wherein the delay circuit includes a plurality of unit delay circuits having associated delay times, the unit delays being connected in series, and wherein the delay control circuit reduces the associated delay times responsive to the first phase comparison signal and increases the associated delay times responsive to the second phase comparison signal.

9. A circuit according to claim 1 wherein the delay control circuit detects a difference in phase of the input clock signal, the intermediate clock signal and the output clock signal and applies the delay control signal responsive to the detected difference in phase.

10. A phase detector apparatus, comprising:
a phase detector circuit that receives an input clock signal, an intermediate clock signal and an output clock signal and generates a first phase comparison signal when, following the transition of the intermediate clock signal, the transition of the output clock signal lags the transition of the input clock signal and a second phase comparison signal when the transition of the output clock signal leads the transition of the input clock signal;
wherein the transitions are edges and wherein the phase detector circuit comprises:
a first flip-flop having a clock input, a reset input and an output, the first flip-flop receiving the intermediate clock signal at the clock input to set a ready signal at the output responsive to the edge of the intermediate clock signal and to reset the ready signal responsive to a reset signal at the reset input;
a second flip-flop having a clock input, a data input connected to the ready signal, a reset input and an output, the second flip-flop receiving the input clock signal at the clock input and the ready signal at the data input to set the first phase comparison signal at the output of the second flip-flop responsive to the edge of the input clock signal and to reset the first phase comparison signal responsive to a reset signal at the reset input;
a third flip-flop having a clock input, a data input connected to the ready signal, a reset input, and an output, the third flip-flop receiving the output clock signal at the clock input to set the second phase comparison signal at the output of the third flip-flop responsive to the edge of the output clock signal and to reset the second phase comparison signal responsive to a reset signal at the reset input; and a reset circuit coupled to the reset inputs of the first, second and third flip-flops that applies the reset signals to the reset inputs of the first, second and third flip flops responsive to setting of all of the ready signal, the second phase comparison signal and the first phase comparison signal.

11. A phase detector apparatus, comprising:

a phase detector circuit that receives an input clock signal, an intermediate clock signal and an output clock signal and generates a first phase comparison signal when, following the transition of the intermediate clock signal, the transition of the output clock signal lags the transition of the input clock signal and a second phase comparison signal when the transition of the output clock signal leads the transition of the input clock signal;

wherein the transitions are edges and wherein the phase detector circuit comprises:

a first flip-flop that sets a ready signal responsive to the edge of the intermediate clock signal and resets the ready signal responsive to a reset signal;

a second flip-flop that sets the first phase comparison signal responsive to the edge of the input clock signal and resets the first phase comparison signal responsive to the reset signal;

a third flip-flop that sets the second phase comparison signal responsive to the edge of the output clock signal and resets the second phase comparison signal responsive to the reset signal; and a reset circuit that sets the reset signal responsive to setting of all of the ready signal, the second phase comparison signal and the first phase comparison signal.

12. A method of producing a delayed signal from a periodic input signal, the method comprising the steps of:

generating an intermediate signal from the periodic input signal, the intermediate signal being delayed from the periodic input signal;

generating a delayed signal from the periodic input signal, the delayed signal being delayed from the intermediate signal;

determining whether a transition of the periodic input signal leads or lags a transition of the delayed signal following a transition of the intermediate signal;

varying the delay of the delayed signal with respect to the periodic input signal based on the determination of whether the transition of the periodic input signal leads or lags the transition of the delayed signal; and wherein said step of varying comprises at least one of the steps of:

asserting a first phase comparison signal for a time extending substantially from the transition of the input clock signal to the transition of the output clock signal when, following the transition of the intermediate clock signal, the transition of the input clock signal leads the transition of the delayed clock signal; or asserting a second phase comparison signal for a time extending substantially from the transition of the output clock signal to the transition of the input clock signal when, following the transition of the intermediate clock signal, the transition of the input clock signal lags the transition of the delayed clock signal.

13. A method according to claim 12, wherein the periodic input signal comprises an input clock signal, wherein the delayed signal comprises a delayed clock signal, and wherein the transitions are rising edges.

14. A method according to claim 13:

wherein said step of varying further comprises the steps of:

generating a delay control signal responsive to the first and second phase comparison signals; and varying the delay of the delayed clock signal responsive to the delay control signal.

15. A system for producing a delayed signal from a periodic input signal, the comprising:

means for generating an intermediate signal from the periodic input signal, the intermediate signal being delayed from the periodic input signal;

means for generating a delayed signal from the periodic input signal, the delayed signal being delayed from the intermediate signal;

means for determining whether a transition of the periodic input signal leads or lags a transition of the delayed signal following a transition of the intermediate signal;

means responsive to the means for determining for varying the delay of the delayed signal with respect to the periodic input signal based on the determination of whether the transition of the periodic input signal leads or lags the transition of the delayed signal; and wherein said means responsive to the means for determining for varying comprises at least one of:

means for asserting a first phase comparison signal for a time extending substantially from the transition of the input clock signal to the transition of the output clock signal when, following the transition of the intermediate clock signal, the transition of the input clock signal leads the transition of the delayed clock signal; or means for asserting a second phase comparison signal for a time extending substantially from the transition of the output clock signal to the transition of the input clock signal when, following the transition of the intermediate clock signal, the transition of the input clock signal lags the transition of the delayed clock signal.

16. A system according to claim 15, wherein the periodic input signal comprises an input clock signal, wherein the delayed signal comprises a delayed clock signal, and wherein the transitions are rising edges.

17. A system according to claim 16:

wherein said means responsive to the means for determining for varying the delay of the delayed signal with respect to the periodic input signal further comprises:

means for generating a delay control signal responsive to the first and second phase comparison signals; and means for varying the delay of the delayed clock signal responsive to the delay control signal.

* * * * *